(12) United States Patent
Henzler et al.

(10) Patent No.: US 11,277,948 B2
(45) Date of Patent: Mar. 15, 2022

(54) CONFORMALLY SHIELDED POWER INDUCTOR AND OTHER PASSIVE DEVICES FOR 4/5G ENVELOPE TRACKER MODULES AND/OR OTHER POWER MANAGEMENT MODULES

(71) Applicant: Apple Inc., Cupertino, CA (US)

(72) Inventors: Stephan Henzler, Munich (DE); Eckehard Plaettner, Deisenhofen (DE)

(73) Assignee: Apple Inc., Cupertino, CA (US)

( * ) Notice: Subject to any disclaimer, the term of this patent is extended or adjusted under 35 U.S.C. 154(b) by 90 days.

(21) Appl. No.: 16/299,601

(22) Filed: Mar. 12, 2019

(65) Prior Publication Data
US 2019/0297757 A1 Sep. 26, 2019

Related U.S. Application Data

(60) Provisional application No. 62/646,675, filed on Mar. 22, 2018.

(51) Int. Cl.
*H05K 9/00* (2006.01)
*H05K 1/18* (2006.01)
*H05K 1/11* (2006.01)

(52) U.S. Cl.
CPC .......... *H05K 9/0024* (2013.01); *H05K 1/181* (2013.01); *H05K 1/185* (2013.01); *H05K 1/11* (2013.01); *H05K 2201/1003* (2013.01); *H05K 2201/10015* (2013.01); *H05K 2201/10371* (2013.01); *H05K 2201/10378* (2013.01)

(58) Field of Classification Search
CPC ...... H05K 9/0024; H05K 1/185; H05K 1/181; H05K 2201/10015; H05K 2201/10371; H05K 2201/10378; H05K 2201/1003; H05K 1/11; H05K 1/0216
See application file for complete search history.

(56) References Cited

U.S. PATENT DOCUMENTS

| | | | |
|---|---|---|---|
| 10,049,961 B1* | 8/2018 | Qi | H01L 23/49816 |
| 10,332,821 B2* | 6/2019 | Qi | H01L 23/552 |
| 2006/0152913 A1* | 7/2006 | Richey | H05K 9/0024 |
| | | | 361/818 |
| 2008/0174395 A1* | 7/2008 | Lee | H01F 17/0006 |
| | | | 336/69 |
| 2010/0108370 A1* | 5/2010 | Kapusta | H05K 1/181 |
| | | | 174/260 |
| 2011/0235302 A1* | 9/2011 | Hijioka | H01L 23/5227 |
| | | | 361/811 |

(Continued)

*Primary Examiner* — Hung S. Bui
*Assistant Examiner* — Sagar Shrestha
(74) *Attorney, Agent, or Firm* — Eschweiler & Potashnik, LLC (57) ABSTRACT

A circuit assembly includes a printed circuit board (PCB), and a power management arrangement positioned on and electrically coupled to the PCB. The power management arrangement includes a substrate, a power management circuit chip positioned on and electrically coupled to the substrate, and a shield can positioned over the substrate and providing electromagnetic shielding for the power management chip. The circuit assembly further includes a self-shielded coil positioned on and electrically coupled to the PCB, wherein the self-shielded coil is positioned adjacent to the power management arrangement.

20 Claims, 7 Drawing Sheets

(56) References Cited

U.S. PATENT DOCUMENTS

| | | | |
|---|---|---|---|
| 2012/0044653 A1* | 2/2012 | Morris | H05K 9/0024 |
| | | | 361/728 |
| 2012/0243199 A1* | 9/2012 | Wu | H05K 9/003 |
| | | | 361/818 |
| 2013/0063902 A1* | 3/2013 | Yoshida | H05K 1/0209 |
| | | | 361/728 |
| 2014/0153196 A1* | 6/2014 | Takizawa | H05K 3/284 |
| | | | 361/728 |
| 2015/0194387 A1* | 7/2015 | Yazar | H01L 23/552 |
| | | | 174/350 |
| 2016/0066481 A1* | 3/2016 | Malek | H05K 1/181 |
| | | | 361/760 |
| 2018/0084637 A1* | 3/2018 | Ueda | H01Q 21/06 |
| 2018/0303012 A1* | 10/2018 | Lin | H05K 9/0037 |
| 2019/0297757 A1* | 9/2019 | Henzler | H05K 9/0024 |

* cited by examiner

Example UE
FIG. 9

1

CONFORMALLY SHIELDED POWER INDUCTOR AND OTHER PASSIVE DEVICES FOR 4/5G ENVELOPE TRACKER MODULES AND/OR OTHER POWER MANAGEMENT MODULES

CROSS REFERENCE TO RELATED APPLICATION

This application claims the benefit of priority to U.S. Provisional Patent Application No. 62/646,675 filed on Mar. 22, 2018 which is incorporated herein in its entirety for all purposes.

FIELD

The present disclosure relates to power inductor structures and circuit assemblies for portable devices and other applications.

BACKGROUND

Highly integrated small form factor communication equipment such as smart phones, smart watches, other smart wearables etc. experience the trend to replace classic RF shield cans by conformally shielded modules or casings. The purpose is the same as for the shield cans, namely the shielding of electromagnetic emission which deteriorates system performance and regulatory requirements.

In the PMIC field (power management integrated circuits and envelope tracker circuits) there are coils (power inductors) which require low DC resistance, high quality factor and relatively high inductance (~0.1 uF-4.7 uH). These key figures determine the performance (transient performance and efficiency) of the envelope tracker or the PMIC. Unfortunately, good coil parameters come with high coil volume. If the coil shall now be integrated into a module under the constraint of tight overall height requirements (e.g., 0.7 mm) then a thinner coil needs to be chosen which compromises the coil parameters. Alternatively custom coils could be used which trade x/y area for height. However, such custom parts are disadvantageous for overall solution area and come with a high price.

In other words good coil performance parameters and module integration of the coil are conflicting targets.

BRIEF DESCRIPTION OF THE DRAWINGS

Some examples of circuits, apparatuses and/or methods will be described in the following by way of example only. In this context, reference will be made to the accompanying Figures.

DETAILED DESCRIPTION

Figure 1:
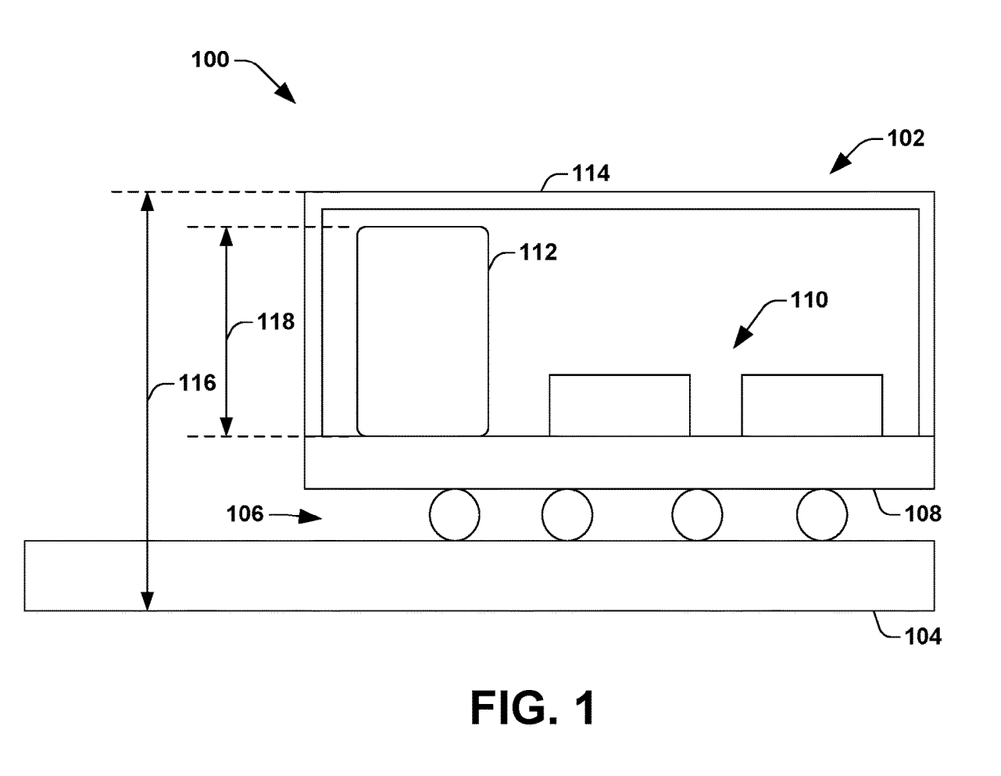
FIG. 1 illustrates an exemplary cross section diagram of a circuit assembly involving power management circuitry.

One solution to address the shielding of electromagnetic emissions is illustrated in FIG. 1. In FIG. 1, an exemplary assembly 100 is shown in which a circuit module 102 is positioned on and electrically coupled to a printed circuit board 104 via solder ball bonds 106. The circuit module 102 comprises a substrate 108 having one or more integrated circuit chips 110 positioned on, or alternatively within, the substrate. The chips 110 are connected electrically to one another via interconnects (not shown) in the substrate, and may also be connected to circuitry external to the module 102 by vias (not shown) that extend through the substrate 108 and then connect to circuits via the solder connections 106 and interconnects (not shown) that extend through the PCB 104.

Still referring to FIG. 1, a coil 112 resides in the module 102, and is positioned on and electrically connected to the substrate 108 via interconnects. The module 102 is then covered by an RF shield can 114 as illustrated. As highlighted above, the RF shield can operates to shield the components (e.g., 110 and 112) therein from electromagnetic emissions which might otherwise deteriorate system performance or compromise or run afoul of regulatory requirements.

As highlighted above, in many instances, due to the fact that the assembly 100 may reside in a mobile or portable, handheld type device such as a smart phone or tablet, a height constraint 116 may exist for the assembly 100. Due to the height of the PCB 104 and the substrate 108 of the module 102, a height 118 of the coil 112 may be limited. As highlighted above, a shorter, or "thinner," coil 112 will satisfy the height constraint 116, but the thin geometry of the coil operates to negatively affect the transient performance and efficiency of the coil 112, by deleteriously impacting the DC resistance, the Q factor, and the inductance of the coil.

Moving the coil 112 outside the module 102 of FIG. 1, however, requires employment of an additional RF shield can for the coil, which, as may be appreciated, limits the height of the coil and further adds significant cost to the entire assembly and makes it harder to manufacture. Reducing the height of the coil 112, and instead increasing it width/length, also negatively impacts cost by increasing the required size of the module 102, which is typically a premium in mobile type applications.

Figure 2:
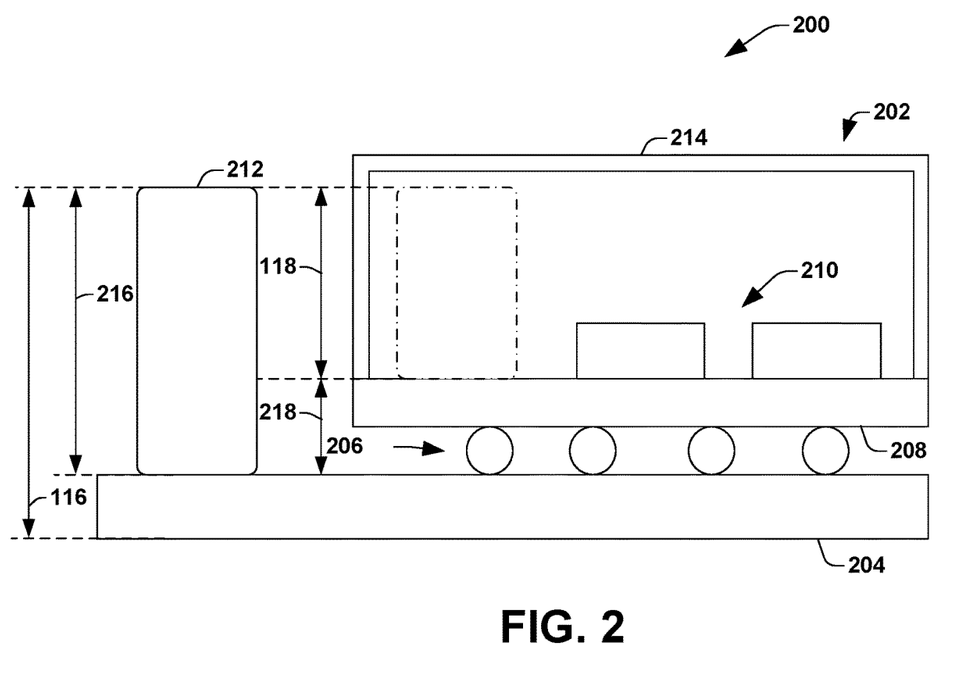
FIG. 2 illustrates an exemplary cross section diagram of a circuit assembly involving power management circuitry according to one embodiment of the disclosure.

FIG. 2 illustrates an exemplary circuit assembly 200 in accordance with at least one embodiment of the disclosure. In FIG. 2, a circuit arrangement 202, for example, a power management module containing one or more power management integrated circuit chips 210, is positioned on and electrically connected to a PCB 204. More particularly, the circuit chips 210 electrically connect to interconnects (not shown) within the PCB 204 through vias (not shown) that extend through a substrate 208 on which the chips 210 reside. The vias extend from a top surface of the substrate 208 down to a bottom surface thereof, and signals pass therethrough down to interconnects in the PCB 204 via solder balls 206 or other conductive connections. The circuit module 202 has an RF shield can or casing 214 that is placed over top of the substrate 208 in order to protect the one or more integrated circuit chips 210 (and any other circuitry on the substrate) from electromagnetic emissions. The RF shield can or casing 214 may also be disposed on the side of the substrate 18, which does not have contacts with the one or more integrated circuit chips 210, to provide same or equivalent protection from electromagnetic emissions to the one or more integrated circuit chips 210.

Still referring to FIG. 2, as seen therein, a coil is no longer place on the substrate 208 inside the RF shield can 214, but instead a coil 212 is positioned on and is electrically connected to the PCB 204. Because the coil 212 of FIG. 2 does not need to be placed within the circuit module 202 (i.e., within the RF shield can 214), a height 216 of the coil 212 is substantially increased from the height 116 of the coil 112 of FIG. 1 by an amount 218, in one example, as shown. That is, the height constraint 116 of the complete assembly 200 stays the same as was shown in FIG. 1, yet the height 216 of the coil 212 can be significantly increased while still satisfying the height constraint. Consequently, the height of the coil 212 is sufficient to satisfy the transient performance and efficiency requirements of the module 202 by exhibiting a satisfactory low DC resistance, high Q factor and high inductance.

Figure 3A:
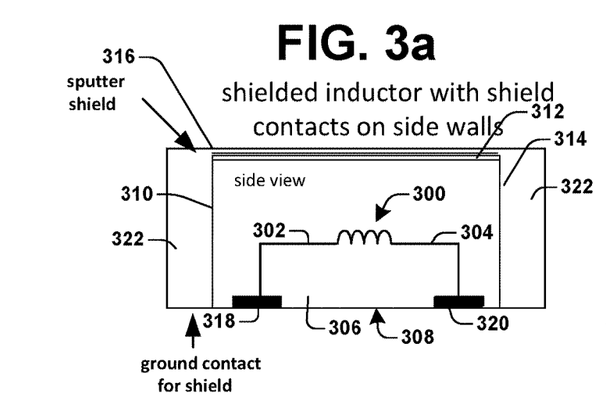
FIGS. 3a-3b are cross section diagrams of a self-shielded coil according to one or more embodiments of the disclosure.

The coil 212 of FIG. 2 can be placed outside the module 202 without requiring an additional RF shield can because the coil 212 comprises a self-shielded coil. In one embodiment, the self-shielded coil comprises a coil conductor, as illustrated in simplified form in FIG. 3a at 300. In FIG. 3a, the coil conductor 300 has a first terminal 302 and a second terminal 304, and is surrounded by an electrically insulative material 306. The insulative material 306 defines an interface surface 308 that is configured to interface with the PCB (e.g., PCB 204 in FIG. 2). Further, the insulative material 306 defines one or more remaining surfaces 310, 312 and 314.

While the embodiment of FIG. 2 is directed to a coil in particular, it should be understood that the disclosure more generically is directed to a reactive circuit element type assembly where the reactive circuit element is self-shielded. In that context, such a reactive circuit element may comprise either a coil (inductor) or a capacitor structure.

Figure 4A:
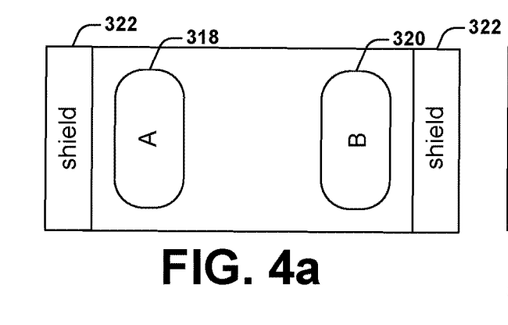
FIGS. 4a-4c are plan views of the self-shielded coils of FIGS. 3a-3b according to one or more embodiments of the disclosure.

Still referring to FIG. 3a, a protective layer (e.g., a conductive film) 316 is formed over at least a portion of the remaining surfaces 310, 312 and 314 (e.g., by sputtering or chemical vapor deposition) as shown. The conductive film conformally surrounds the insulative material 306 and thus the coil inductor 300. First and second contacts 318 and 320 are positioned in the interface surface 308 of the insulative material and electrically couple to the first and second terminals 302 and 304, respectively. Still referring to FIG. 3a, a third contact 322 or set of contacts are positioned in one or more of the one or more remaining surfaces 310, 312 and 314 of the insulative material and serve as a ground contact for the conformal conductive film 316 that serves as an RF shield. In FIG. 3a, the third contact 322 comprises two sidewall contacts, which is further appreciated in the plan view of FIG. 4a. Alternatively, in other embodiments other arrangement may be employed and are contemplated by the present disclosure.

Figure 3B:
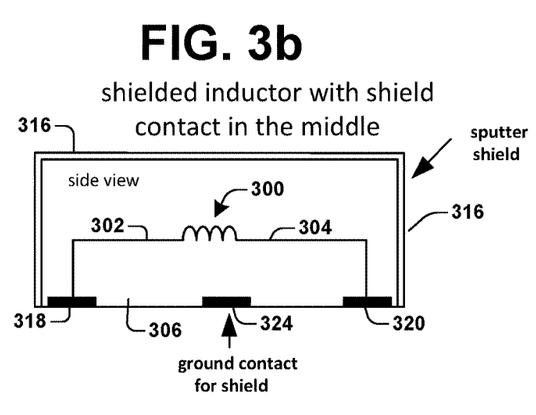
Figure 4B:
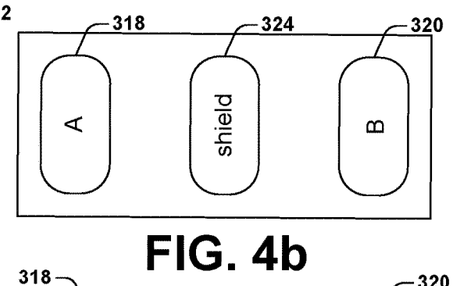
Figure 4C:
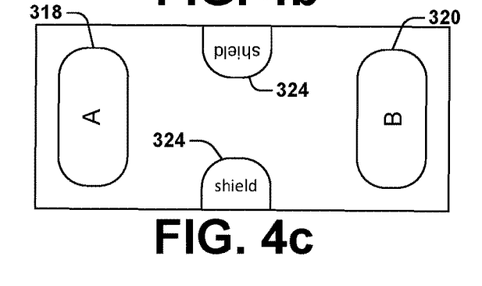

One example of another contact configuration is illustrated in FIG. 3b, wherein the coil conductor 300, first and second terminals 302, 304 and first and second contacts 318, 320 are arranged in a manner similar to that in FIG. 3a. However, FIG. 3b illustrates a third contact 324 that is positioned in the interface surface 308 defined by the insulating material 306. More particularly, the third contact 324 forms a ground contact for the conformal conductive film 316 that operates as an RF shield. The third contact 324 is located between the first and second contacts 318, 320, either in the middle, as illustrated in the plan view of FIG. 4b or as two third contact portions on opposing edges, as illustrated in the plan view of FIG. 4c. The third contact makes electrical contact to the conductive film 316 that serves as the RF shield, and is coupled to a ground potential via the PCB to ground the shield, in one example.

Figure 5:
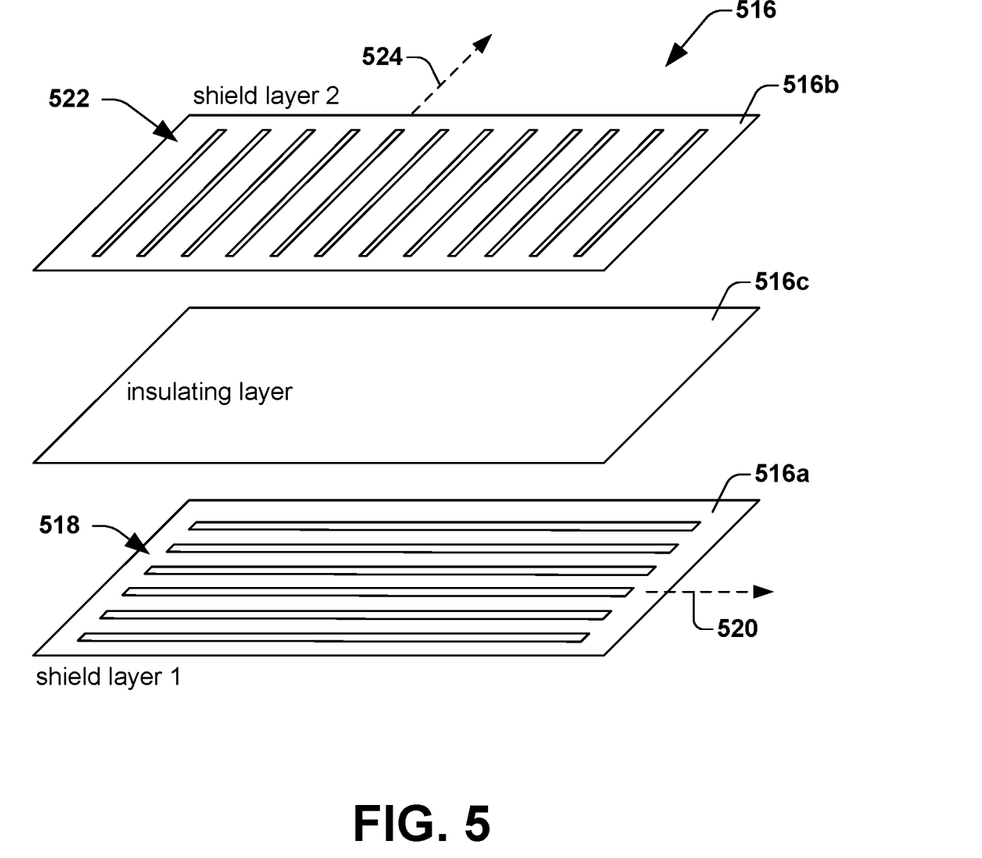
FIG. 5 is an exploded perspective view of a conductive film in a self-shielded coil according to one or more embodiments of the disclosure.

In one embodiment the conductive film of the self-shielded coil comprises a plurality of conductive layer, for example, as illustrated in FIG. 5. FIG. 5 shows a portion of a conductive film 516 that overlies portions of the insulative layer surrounding the coil conductor. The conductive film 516 comprises, in one embodiment, a first conductive shield layer 516a and a second conductive shield layer 516b separated by an electrically insulating layer 516c. In one embodiment the first conductive shield layer 516a comprises a plurality of elongate, parallel slits 518 that extend in a first direction 520. Further, the second conductive shield layer 516b comprises a plurality of elongate, parallel slits 522 that extend in a second direction 524, wherein the first direction 520 and the second direction are different. In one example, the first and second directions are perpendicular or orthogonal to one another. The slits 518 and 522 in the conductive layer 516a, 516b help to reduce eddy currents and thus avoid efficiency losses that may be due to such eddy currents. While the slits in the example of FIG. 5 are elongate, parallel and orthogonal to one another (with respect to the various layers) it should be understood that any arrangement of slits in one or more layers may be employed and is contemplated as falling within the scope of the present disclosure. Note that the various layers may be electrically interconnected and connected to a ground contact at one or more places i.e. there can be a single or multiple interconnections between the layers. Note also that the ground contact can also be connected to an arbitrary potential, e.g., a chassis potential that does not necessarily have to coincide with the nominal ground potential.

In one embodiment, the two layers 516a and 516b are electrically connected together at a position where the magnetic field line created by the coil are essentially parallel to the conductive surface. Further, the two layers 516a and 516b may be connected together electrically at one or more individual points or as a 1-dimensional line type contact, and any other type connection scheme is also contemplated by the present disclosure.

Figure 6:
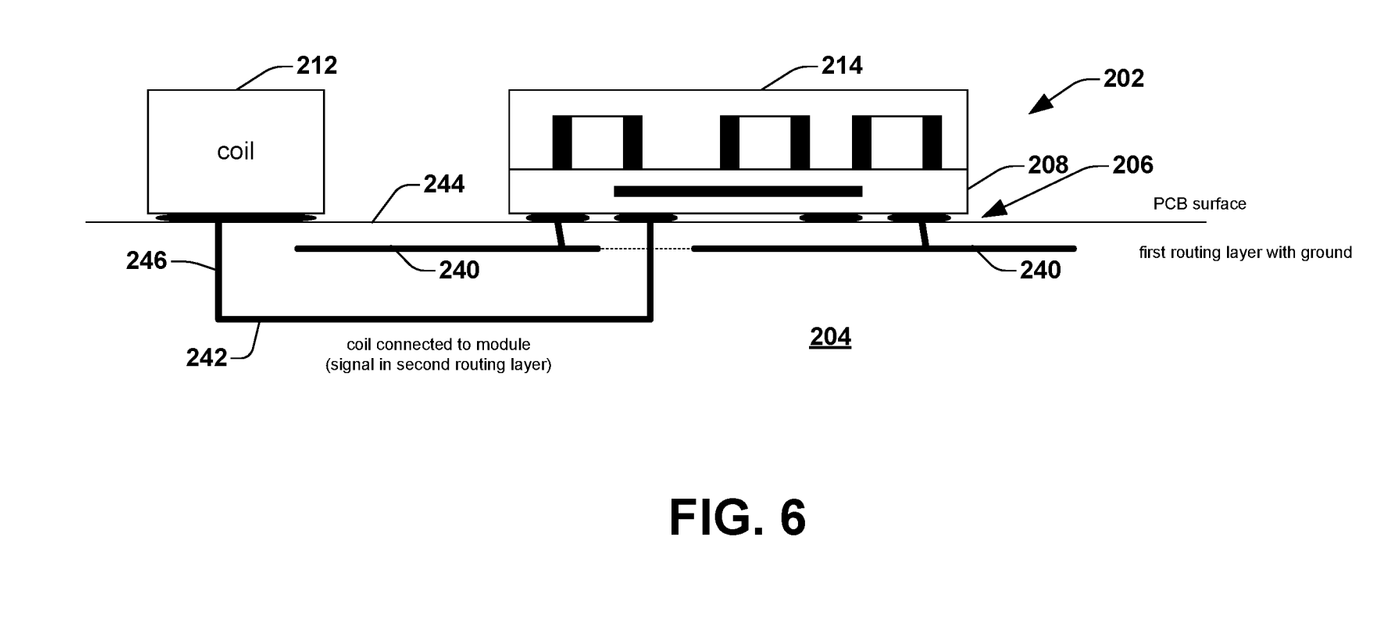
FIG. 6 is a cross section diagram of a circuit assembly showing interconnects according to one or more embodiments of the disclosure.

FIG. 6 is an illustration similar to FIG. 2 (in a slightly simplified form), that shows some of the interconnects that may be employed in both the PCB 204 and the module substrate 208. As shown in FIG. 6, the circuit module 206 (e.g., a power management module) is positioned on and in electrical contact with the PCB 204 and has a plurality of interconnect layers 240, 242 that run laterally through the PCB and electrical contact components on a top surface thereof 244 through vertical interconnects 246 or vias. As shown, a ground potential is maintained via an interconnect 240, while a signal bus carrying electrical signals may be established via the interconnect 242. As can be seen not only is the coil 212 shielded by a conformal conductive layer that operates as a shield thereover, but the signal connection between the coil 212 and the circuit module 202 may also be shielded by a ground potential extending over the top in 240 (and optionally within a second grounded interconnect extending underneath).

Figure 7A:
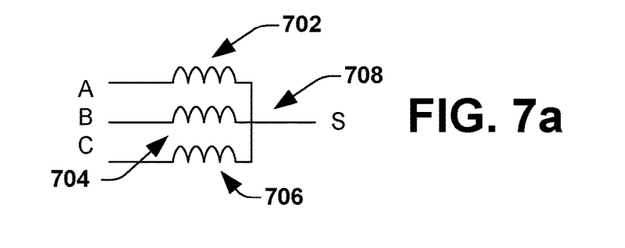
FIG. 7a is a schematic diagram of a coil having three inductors according to one embodiment of the disclosure.
Figure 7B:
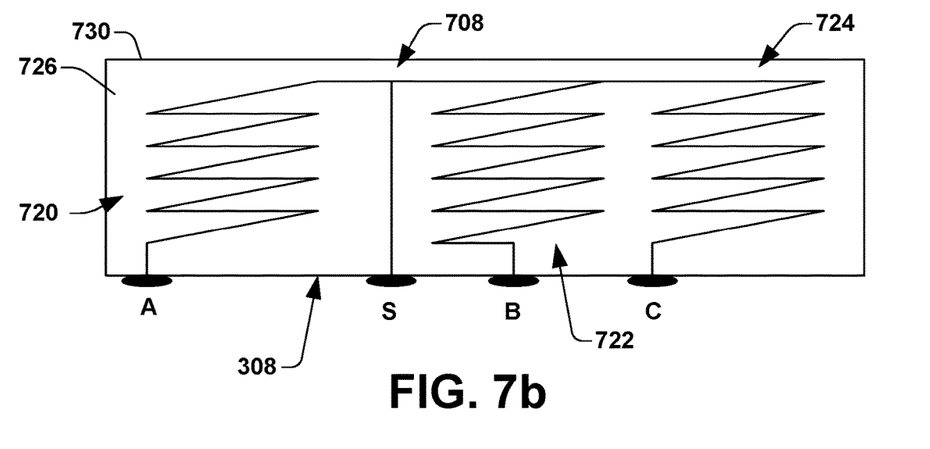
FIG. 7b is a cross section of a self-shielded coil illustrating the inductors of FIG. 7a according to one or more embodiments of the disclosure.

While the coil 212 illustrated in FIG. 2 is illustrated as a single coil, it should be understood that at least one or multiple coils may be formed in a self-shielding fashion. For example, FIGS. 7a-7b illustrates a schematic diagram and simplified coil diagram having multiple coils using a common conformal shield layer. In FIG. 7a, three inductors 702, 704 and 706 have first terminals A, B and C that are isolated from one another, and second terminals that all connect together at a node 708. In FIG. 7b, the coils are represented by three coil conductors 720, 722 and 724 that are each surrounded by an insulative material (e.g., each surrounded with an insulative cladding surrounded by air or surrounded by other polymer type insulating materials) 726, wherein their first terminals are coupled to contacts A, B, and C positioned at the interface surface 308 defined by the insulative material. The second contacts are each connected together at the common node 708 and couple to a contact S that is also positioned at the interface surface 308. A conformal conductive film 730 surrounds portions of the insulating material 726 (not the interface surface 308) and is connected to a ground contact (not shown) that may be employed in any fashion shown in FIGS. 3a-4c. Alternatively the ground contact or shielding contact may be connected to one of the coil contacts, e.g., contact S. This is in particular advantageous if S is anyhow supposed to be grounded from the circuit point of view.

Figures 8A, 8B:
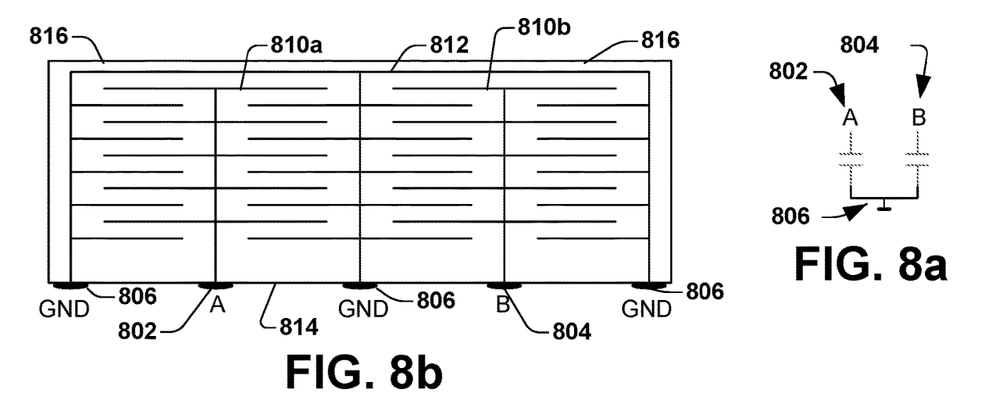
FIG. 8a is a schematic diagram of multiple capacitors according to one embodiment of the disclosure.
FIG. 8b is a cross section of a self-shielded capacitor structure for the capacitors of FIG. 8a according to one embodiment of the disclosure.

In FIGS. 8a-8b it is shown that the self-shielding technique employed for the coil of FIGS. 3a-4c can also be employed with a capacitor structure or a plurality of capacitors. In FIG. 8a, two capacitors have first terminals 802 and 804, and second terminals connected together at a common node 806. The schematic illustration of FIG. 8a is shown in FIG. 8b using a self-shielding technique according to the present disclosure.

In FIG. 8b two networks of interleaved conductors 810a, 810b and 812 are provided as shown. The conductors are surrounded with an electrically insulative material 814, but for terminals that are coupled to contacts A, B, GND at an interface surface define by the insulative material 814. At least a portion of the remaining surfaces of the insulative material (i.e., not the interface surface) is coated with a conformal conductive film 816 (e.g., via sputtering). The surrounding conductive film may be coupled to the GND contacts and thus operates as n RF shield for the capacitor structures. If such film is not coupled to the GND contacts, the structure 812 operates to surround the capacitors and thus at least one plate operates to shield the capacitors.

The self-shielded coil disclosed herein may be employed in power management circuitry such as a power management module, as shown in FIG. 2. Such power management circuitry may be employed in a number of different applications, such as a mobile device or user equipment (UE). Such a device application and example device is illustrated in FIG. 9.

Figure 9:
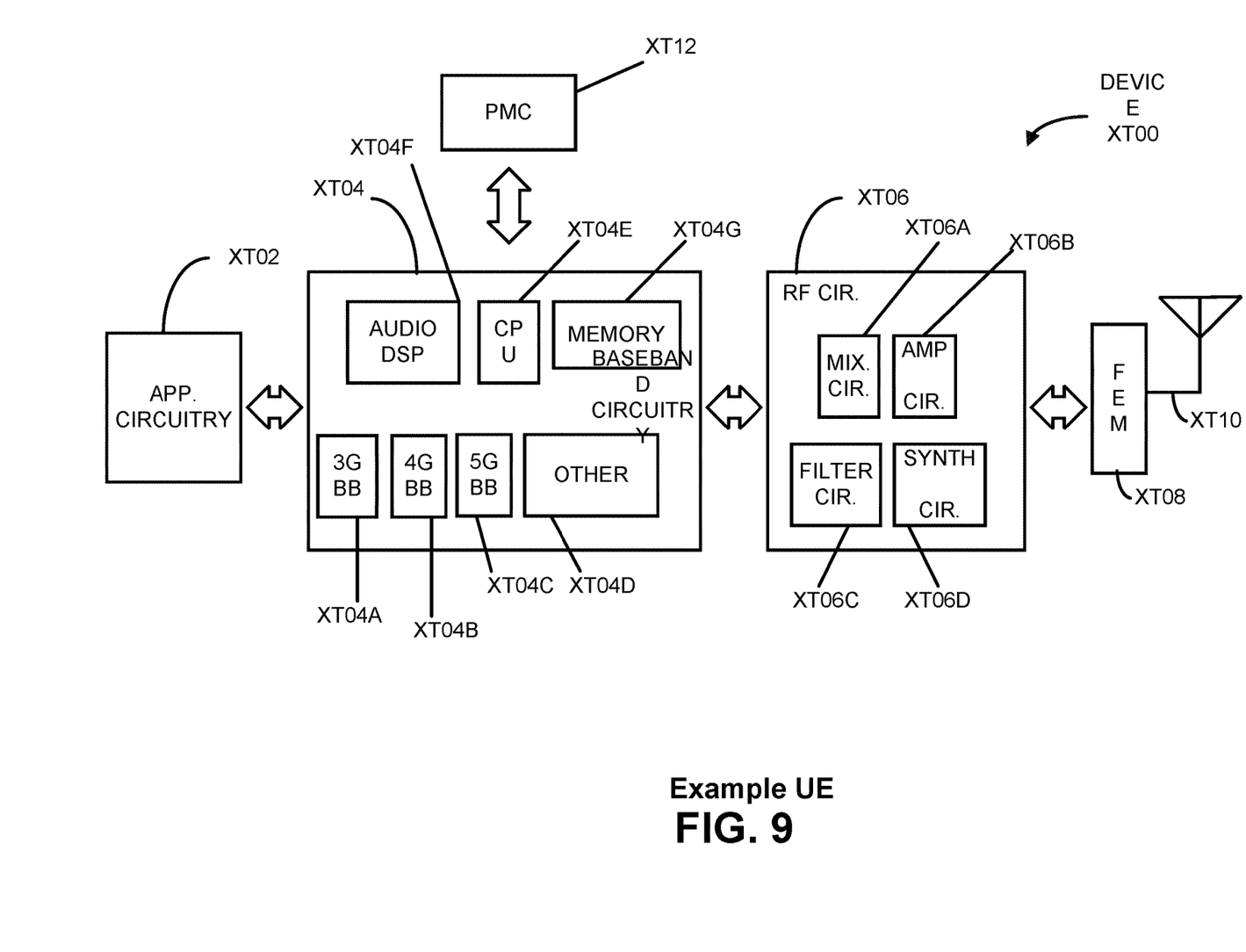
FIG. 9 is a block diagram of a user equipment (UE) according to one embodiment of the disclosure.

FIG. 9 illustrates example components of a device XT00 in accordance with some embodiments. In some embodiments, the device XT00 may include application circuitry XT02, baseband circuitry XT04, Radio Frequency (RF) circuitry XT06, front-end module (FEM) circuitry XT08, one or more antennas XT10, and power management circuitry (PMC) XT12 coupled together at least as shown. The components of the illustrated device XT00 may be included in a UE or a RAN node. In some embodiments, the device XT00 may include less elements (e.g., a RAN node may not utilize application circuitry XT02, and instead include a processor/controller to process IP data received from an EPC). In some embodiments, the device XT00 may include additional elements such as, for example, memory/storage, display, camera, sensor, or input/output (I/O) interface. In other embodiments, the components described below may be included in more than one device (e.g., said circuitries may be separately included in more than one device for Cloud-RAN (C-RAN) implementations).

The application circuitry XT02 may include one or more application processors. For example, the application circuitry XT02 may include circuitry such as, but not limited to, one or more single-core or multi-core processors. The processor(s) may include any combination of general-purpose processors and dedicated processors (e.g., graphics processors, application processors, etc.). The processors may be coupled with or may include memory/storage and may be configured to execute instructions stored in the memory/storage to enable various applications or operating systems to run on the device XT00. In some embodiments, processors of application circuitry XT02 may process IP data packets received from an EPC.

The baseband circuitry XT04 may include circuitry such as, but not limited to, one or more single-core or multi-core processors. The baseband circuitry XT04 may include one or more baseband processors or control logic to process baseband signals received from a receive signal path of the RF circuitry XT06 and to generate baseband signals for a transmit signal path of the RF circuitry XT06. Baseband processing circuity XT04 may interface with the application circuitry XT02 for generation and processing of the baseband signals and for controlling operations of the RF circuitry XT06. For example, in some embodiments, the baseband circuitry XT04 may include a third generation (3G) baseband processor XT04A, a fourth generation (4G) baseband processor XT04B, a fifth generation (5G) baseband processor XT04C, or other baseband processor(s) XT04D for other existing generations, generations in development or to be developed in the future (e.g., second generation (2G), sixth generation (6G), etc.). The baseband circuitry XT04 (e.g., one or more of baseband processors XT04A-D) may handle various radio control functions that enable communication with one or more radio networks via the RF circuitry XT06. In other embodiments, some or all of the functionality of baseband processors XT04A-D may be included in modules stored in the memory XT04G and executed via a Central Processing Unit (CPU) XT04E. The radio control functions may include, but are not limited to, signal modulation/demodulation, encoding/decoding, radio frequency shifting, etc. In some embodiments, modulation/demodulation circuitry of the baseband circuitry XT04 may include Fast-Fourier Transform (FFT), precoding, or constellation mapping/demapping functionality. In some embodiments, encoding/decoding circuitry of the baseband circuitry XT04 may include convolution, tail-biting convolution, turbo, Viterbi, or Low Density Parity Check (LDPC) encoder/decoder functionality. Embodiments of modulation/demodulation and encoder/decoder functionality are not limited to these examples and may include other suitable functionality in other embodiments.

In some embodiments, the baseband circuitry XT04 may include one or more audio digital signal processor(s) (DSP)

XT04F. The audio DSP(s) XT04F may be include elements for compression/decompression and echo cancellation and may include other suitable processing elements in other embodiments. Components of the baseband circuitry may be suitably combined in a single chip, a single chipset, or disposed on a same circuit board in some embodiments. In some embodiments, some or all of the constituent components of the baseband circuitry XT04 and the application circuitry XT02 may be implemented together such as, for example, on a system on a chip (SOC).

In some embodiments, the baseband circuitry XT04 may provide for communication compatible with one or more radio technologies. For example, in some embodiments, the baseband circuitry XT04 may support communication with an evolved universal terrestrial radio access network (EU-TRAN) or other wireless metropolitan area networks (WMAN), a wireless local area network (WLAN), a wireless personal area network (WPAN). Embodiments in which the baseband circuitry XT04 is configured to support radio communications of more than one wireless protocol may be referred to as multi-mode baseband circuitry.

RF circuitry XT06 may enable communication with wireless networks using modulated electromagnetic radiation through a non-solid medium. In various embodiments, the RF circuitry XT06 may include switches, filters, amplifiers, etc. to facilitate the communication with the wireless network. RF circuitry XT06 may include a receive signal path which may include circuitry to down-convert RF signals received from the FEM circuitry XT08 and provide baseband signals to the baseband circuitry XT04. RF circuitry XT06 may also include a transmit signal path which may include circuitry to up-convert baseband signals provided by the baseband circuitry XT04 and provide RF output signals to the FEM circuitry XT08 for transmission.

In some embodiments, the receive signal path of the RF circuitry XT06 may include mixer circuitry XT06a, amplifier circuitry XT06b and filter circuitry XT06c. In some embodiments, the transmit signal path of the RF circuitry XT06 may include filter circuitry XT06c and mixer circuitry XT06a. RF circuitry XT06 may also include synthesizer circuitry XT06d for synthesizing a frequency for use by the mixer circuitry XT06a of the receive signal path and the transmit signal path. In some embodiments, the mixer circuitry XT06a of the receive signal path may be configured to down-convert RF signals received from the FEM circuitry XT08 based on the synthesized frequency provided by synthesizer circuitry XT06d. The amplifier circuitry XT06b may be configured to amplify the down-converted signals and the filter circuitry XT06c may be a low-pass filter (LPF) or band-pass filter (BPF) configured to remove unwanted signals from the down-converted signals to generate output baseband signals. Output baseband signals may be provided to the baseband circuitry XT04 for further processing. In some embodiments, the output baseband signals may be zero-frequency baseband signals, although this is not a requirement. In some embodiments, mixer circuitry XT06a of the receive signal path may comprise passive mixers, although the scope of the embodiments is not limited in this respect.

In some embodiments, the mixer circuitry XT06a of the transmit signal path may be configured to up-convert input baseband signals based on the synthesized frequency provided by the synthesizer circuitry XT06d to generate RF output signals for the FEM circuitry XT08. The baseband signals may be provided by the baseband circuitry XT04 and may be filtered by filter circuitry XT06c.

In some embodiments, the mixer circuitry XT06a of the receive signal path and the mixer circuitry XT06a of the transmit signal path may include two or more mixers and may be arranged for quadrature downconversion and upconversion, respectively. In some embodiments, the mixer circuitry XT06a of the receive signal path and the mixer circuitry XT06a of the transmit signal path may include two or more mixers and may be arranged for image rejection (e.g., Hartley image rejection). In some embodiments, the mixer circuitry XT06a of the receive signal path and the mixer circuitry XT06a may be arranged for direct downconversion and direct upconversion, respectively. In some embodiments, the mixer circuitry XT06a of the receive signal path and the mixer circuitry XT06a of the transmit signal path may be configured for super-heterodyne operation.

In some embodiments, the output baseband signals and the input baseband signals may be analog baseband signals, although the scope of the embodiments is not limited in this respect. In some alternate embodiments, the output baseband signals and the input baseband signals may be digital baseband signals. In these alternate embodiments, the RF circuitry XT06 may include analog-to-digital converter (ADC) and digital-to-analog converter (DAC) circuitry and the baseband circuitry XT04 may include a digital baseband interface to communicate with the RF circuitry XT06.

In some dual-mode embodiments, a separate radio IC circuitry may be provided for processing signals for each spectrum, although the scope of the embodiments is not limited in this respect.

In some embodiments, the synthesizer circuitry XT06d may be a fractional-N synthesizer or a fractional N/N+1 synthesizer, although the scope of the embodiments is not limited in this respect as other types of frequency synthesizers may be suitable. For example, synthesizer circuitry XT06d may be a delta-sigma synthesizer, a frequency multiplier, or a synthesizer comprising a phase-locked loop with a frequency divider.

The synthesizer circuitry XT06d may be configured to synthesize an output frequency for use by the mixer circuitry XT06a of the RF circuitry XT06 based on a frequency input and a divider control input. In some embodiments, the synthesizer circuitry XT06d may be a fractional N/N+1 synthesizer.

In some embodiments, frequency input may be provided by a voltage controlled oscillator (VCO), although that is not a requirement. Divider control input may be provided by either the baseband circuitry XT04 or the applications processor XT02 depending on the desired output frequency. In some embodiments, a divider control input (e.g., N) may be determined from a look-up table based on a channel indicated by the applications processor XT02.

Synthesizer circuitry XT06d of the RF circuitry XT06 may include a divider, a delay-locked loop (DLL), a multiplexer and a phase accumulator. In some embodiments, the divider may be a dual modulus divider (DMD) and the phase accumulator may be a digital phase accumulator (DPA). In some embodiments, the DMD may be configured to divide the input signal by either N or N+1 (e.g., based on a carry out) to provide a fractional division ratio. In some example embodiments, the DLL may include a set of cascaded, tunable, delay elements, a phase detector, a charge pump and a D-type flip-flop. In these embodiments, the delay elements may be configured to break a VCO period up into Nd equal packets of phase, where Nd is the number of delay elements in the delay line. In this way, the DLL provides negative feedback to help ensure that the total delay through the delay line is one VCO cycle.

In some embodiments, synthesizer circuitry XT06d may be configured to generate a carrier frequency as the output frequency, while in other embodiments, the output frequency may be a multiple of the carrier frequency (e.g., twice the carrier frequency, four times the carrier frequency) and used in conjunction with quadrature generator and divider circuitry to generate multiple signals at the carrier frequency with multiple different phases with respect to each other. In some embodiments, the output frequency may be a LO frequency (fLO). In some embodiments, the RF circuitry XT06 may include an IQ/polar converter.

FEM circuitry XT08 may include a receive signal path which may include circuitry configured to operate on RF signals received from one or more antennas XT10, amplify the received signals and provide the amplified versions of the received signals to the RF circuitry XT06 for further processing. FEM circuitry XT08 may also include a transmit signal path which may include circuitry configured to amplify signals for transmission provided by the RF circuitry XT06 for transmission by one or more of the one or more antennas XT10. In various embodiments, the amplification through the transmit or receive signal paths may be done solely in the RF circuitry XT06, solely in the FEM XT08, or in both the RF circuitry XT06 and the FEM XT08.

In some embodiments, the FEM circuitry XT08 may include a TX/RX switch to switch between transmit mode and receive mode operation. The FEM circuitry may include a receive signal path and a transmit signal path. The receive signal path of the FEM circuitry may include an LNA to amplify received RF signals and provide the amplified received RF signals as an output (e.g., to the RF circuitry XT06). The transmit signal path of the FEM circuitry XT08 may include a power amplifier (PA) to amplify input RF signals (e.g., provided by RF circuitry XT06), and one or more filters to generate RF signals for subsequent transmission (e.g., by one or more of the one or more antennas XT10).

In some embodiments, the PMC XT12 may manage power provided to the baseband circuitry XT04. In particular, the PMC XT12 may control power-source selection, voltage scaling, battery charging, or DC-to-DC conversion. The PMC XT12 may often be included when the device XT00 is capable of being powered by a battery, for example, when the device is included in a UE. The PMC XT12 may increase the power conversion efficiency while providing desirable implementation size and heat dissipation characteristics. The power management module highlighted in FIG. 2 may, in one embodiment, be employed in the PMC XT12.

While FIG. 9 shows the PMC XT12 coupled only with the baseband circuitry XT04. However, in other embodiments, the PMC XT 12 may be additionally or alternatively coupled with, and perform similar power management operations for, other components such as, but not limited to, application circuitry XT02, RF circuitry XT06, or FEM XT08. For example, the power management module of FIG. 2 may be employed in envelope tracking (ET) systems that may employ a DC-DC converter for supply voltage control. In such instances, the DC-DC converter may utilize a coil such as the self-shielded coil in conjunction with the power management module that may include a DC-DC converter integrated circuit chip and/or other power management circuitry chips.

In some embodiments, the PMC XT12 may control, or otherwise be part of, various power saving mechanisms of the device XT00. For example, if the device XT00 is in an RRC_Connected state, where it is still connected to the RAN node as it expects to receive traffic shortly, then it may enter a state known as Discontinuous Reception Mode (DRX) after a period of inactivity. During this state, the device XT00 may power down for brief intervals of time and thus save power.

If there is no data traffic activity for an extended period of time, then the device XT00 may transition off to an RRC_Idle state, where it disconnects from the network and does not perform operations such as channel quality feedback, handover, etc. The device XT00 goes into a very low power state and it performs paging where again it periodically wakes up to listen to the network and then powers down again. The device XT00 may not receive data in this state, in order to receive data, it must transition back to RRC_Connected state.

An additional power saving mode may allow a device to be unavailable to the network for periods longer than a paging interval (ranging from seconds to a few hours). During this time, the device is totally unreachable to the network and may power down completely. Any data sent during this time incurs a large delay and it is assumed the delay is acceptable.

Processors of the application circuitry XT02 and processors of the baseband circuitry XT04 may be used to execute elements of one or more instances of a protocol stack. For example, processors of the baseband circuitry XT04, alone or in combination, may be used execute Layer 3, Layer 2, or Layer 1 functionality, while processors of the application circuitry XT04 may utilize data (e.g., packet data) received from these layers and further execute Layer 4 functionality (e.g., transmission communication protocol (TCP) and user datagram protocol (UDP) layers). As referred to herein, Layer 3 may comprise a radio resource control (RRC) layer, described in further detail below. As referred to herein, Layer 2 may comprise a medium access control (MAC) layer, a radio link control (RLC) layer, and a packet data convergence protocol (PDCP) layer, described in further detail below. As referred to herein, Layer 1 may comprise a physical (PHY) layer of a UE/RAN node, described in further detail below.

In an Example 1, a circuit assembly comprises a printed circuit board (PCB), and a power management module positioned on and electrically coupled to the PCB. The power management module comprises a substrate, a power management circuit chip positioned on and electrically coupled to the substrate, and a shield can positioned over the substrate and providing electromagnetic shielding for the power management chip. The circuit assembly further comprises a self-shielded coil positioned on and electrically coupled to the PCB, wherein the self-shielded coil is positioned adjacent to the power management module.

In an Example 2 that depends upon Example 1, a collective height of the PCB and the power management module comprises a first height, and a collective height of the self-shielded coil and the PCB comprises a second height. Further, the second height is less than or equal to the first height.

In an Example 3 that depends upon Example 1, the self-shielded coil comprises a coil conductor having a first terminal and a second terminal, and an electrically insulative material surrounding the coil conductor and leaving exposed a first contact coupled to the first terminal and a second contact coupled to the second terminal, the electrically insulative material defining an interface surface configured to interface with the PCB, and one or more remaining surfaces. The self-shielded coil further comprises a conductive film formed over at least a portion of the remaining surfaces of the electrically insulative material.

In an Example 4 that depends upon Example 3, the first contact and the second contact are positioned in the interface surface.

In an Example 5 that depends upon Example 4, the self-shielded coil further comprises a third contact coupled to the conductive film, and the third contact is positioned in one or more of the one or more remaining surfaces.

In an Example 6 that depends upon Example 4, the self-shielded coil further comprises a third contact coupled to the conductive film and positioned in the interface surface.

In an Example 7 that depends upon Example 6, the first contact and the second contact are spaced apart from one another, and the third contact is positioned between the first contact and the second contact.

In an Example 8 that depends upon Example 7, the third contact comprises a first third contact portion and a second third contact portion, each positioned between the first contact and the second contact, and positioned at opposing edges of the interface surface.

In an Example 9 that depends upon an Example 3, the conductive film comprises a first conductive layer having one or more slits configured to reduce eddy currents in the first conductive layer.

In an Example 10 that depends upon an Example 9, the conductive film comprises a second conductive layer and an insulative layer between the first and second conductive layers, wherein the second conductive layer comprises one or more slits that differ from the one or more slits in the first conductive layer.

In an Example 11 that depends upon an Example 9, the one or more slits comprise a plurality of elongate, parallel slits extending in a first direction.

In an Example 12 that depends upon an Example 11, the conductive film comprises a second conductive layer and an insulative layer between the first and second conductive layers, wherein the second conductive layer comprises a plurality of elongate, parallel slits extending in a second, different direction.

In an Example 13 that depends upon an Example 12, the first direction and the second direction are generally perpendicular to one another.

In an Example 14 that depends upon an Example 1, the assembly further comprises a first routing layer extending in the PCB and making electrical contact to the self-shielded coil at a first contact end, and making electrical contact to the substrate of the power management module at a second opposing contact end.

In an Example 15 that depends upon an Example 14, the assembly further comprises a contact via extending through the substrate of the power management module and making electrical contact to the power management chip on a top surface of the substrate, and making electrical contact to the first routing layer on a bottom surface of the substrate.

In an Example 16 that depends upon an Example 14, the assembly further comprises a second routing layer extending in the PCB and making electrical contact to a shield portion of the self-shielded coil, wherein the second routing layer is associated with a ground potential to ground the shield portion of the self-shielded coil.

In an Example 17 that depends upon an Example 16, the assembly further comprises a contact via extending through the substrate of the power management module and making electrical contact to the power management chip on a top surface of the substrate, and making electrical contact to the second routing layer on a bottom surface of the substrate.

In an Example 18 that depends upon an Example 1, the self-shielded coil comprises a plurality of coil conductor each having a first terminal and a second terminal, and an electrically insulative material surrounding each of the plurality of coil conductors and leaving exposed a plurality of first contacts that are coupled to respective first terminals of the plurality of coil conductors. The electrically insulative material defines an interface surface configured to interface with the PCB, and one or more remaining surfaces. The self-shielded coil further comprises a conductive film formed over at least a portion of the remaining surfaces of the electrically insulative material. The second terminals of each of the plurality of coil conductors are connected together and connected a single second contact.

In an Example 19 that depends upon an Example 18, the single second contact is positioned in the interface surface of the electrically insulative material.

In an Example 20 that depends upon an Example 1, the self-shielded coil further comprise a coil conductor having a first terminal and a second terminal, and a capacitor structure having a first terminal and a second terminal. The second terminal of the conductor coil is coupled to the first terminal of the capacitor structure for form an intermediate node. The self-shielded coil further comprises an electrically insulative material surrounding the coil conductor and the capacitor structure, and leaving exposed a first contact, a second contact and a third contact that are coupled to the first terminal of the coil conductor, the intermediate node, and the second terminal of the capacitor structure, respectively. The electrically insulating material defines an interface surface configured to interface with the PCB, and one or more remaining surfaces, and the self-shielded coil comprises a conductive film formed over at least a portion of the remaining surfaces of the electrically insulative material.

In an Example 21 that depends upon an Example 20, the first contact and the second contact are positioned in the interface surface defined by the electrically insulative material.

In an Example 22 that depends on an Example 21, the third contact is coupled to the conductive film.

In an Example 23 that depends upon an Example 22, the third contact is positioned in one or more of the one or more remaining surfaces.

In an Example 24 that depends upon an Example 22, the third contact is positioned in the interface surface defined by the electrically insulative material.

In an Example 25 a self-shielded coil assembly is disclosed, and comprises a coil conductor having a first terminal and a second terminal, and an electrically insulative material surrounding the coil conductor and leaving exposed a first contact coupled to the first terminal and a second contact coupled to the second terminal, the electrically insulative material defining an interface surface configured to interface with a substrate, and one or more remaining surfaces. The self-shielded coil assembly further comprises a conductive film formed over at least a portion of the remaining surfaces of the electrically insulative material.

In an Example 26 that depends upon an Example 25, the first contact and the second contact are positioned in the interface surface.

In an Example 27 that depends upon an Example 26, the self-shielded coil further comprises a third contact coupled to the conductive film, and wherein the third contact is positioned in one or more of the one or more remaining surfaces.

In an Example 28 that depends upon Example 26, the self-shielded coil further comprises a third contact coupled to the conductive film and positioned in the interface surface.

In an Example 29 that depends upon Example 28, the first contact and the second contact are spaced apart from one another, and the third contact is positioned between the first contact and the second contact.

In an Example 30 that depends upon Example 29, the third contact comprises a first third contact portion and a second third contact portion, each positioned between the first contact and the second contact, and positioned at opposing edges of the interface surface.

In an Example 31 that depends upon Example 25, the conductive film comprises a first conductive layer having one or more slits configured to reduce eddy currents in the first conductive layer.

In an Example 32 that depends upon Example 31, the conductive film comprises a second conductive layer and an insulative layer between the first and second conductive layers, wherein the second conductive layer comprises one or more slits that differ from the one or more slits in the first conductive layer.

In an Example 33 that depends upon Example 31, the one or more slits comprise a plurality of elongate, parallel slits extending in a first direction.

In an Example 34 that depends upon Example 31, the conductive film comprises a second conductive layer and an insulative layer between the first and second conductive layers, wherein the second conductive layer comprises a plurality of elongate, parallel slits extending in a second, different direction.

In an Example 35 that depends upon Example 34, the first direction and the second direction are generally perpendicular to one another.

In an Example 36 that depends upon Example 25, the self-shielded coil comprises a plurality of coil conductors each having a first terminal and a second terminal, and an electrically insulative material surrounding each of the plurality of coil conductors and leaving exposed a plurality of first contacts that are coupled to respective first terminals of the plurality of coil conductors, the electrically insulative material defining an interface surface configured to interface with the substrate, and one or more remaining surfaces. The self-shielded coil further comprises a conductive film formed over at least a portion of the remaining surfaces of the electrically insulative material. The second terminals of each of the plurality of coil conductors are connected together and connected a single second contact.

In an Example 37 that depends upon Example 36, the single second contact is positioned in the interface surface of the electrically insulative material.

In an Example 38 that depends upon Example 25, the self-shielded coil assembly further comprises a coil conductor having a first terminal and a second terminal, and a capacitor structure having a first terminal and a second terminal, wherein the second terminal of the conductor coil is coupled to the first terminal of the capacitor structure for form an intermediate node. The assembly further comprises an electrically and/or inductively insulative material surrounding the coil conductor and the capacitor structure, and leaving exposed a first contact, a second contact and a third contact that are coupled to the first terminal of the coil conductor, the intermediate node, and the second terminal of the capacitor structure, respectively, the electrically insulating material defining an interface surface configured to interface with the PCB, and one or more remaining surfaces. Lastly, the assembly comprises a conductive film formed over at least a portion of the remaining surfaces of the electrically insulative material.

In an Example 39 that depends upon Example 38, the first contact and the second contact are positioned in the interface surface defined by the electrically insulative material.

In an Example 40 that depends upon Example 39, the third contact is coupled to the conductive film.

In an Example 41 that depends upon Example 40, the third contact is positioned in one or more of the one or more remaining surfaces.

In an Example 42 that depends upon Example 40, the third contact is positioned in the interface surface defined by the electrically insulative material.

In an Example 43, a circuit assembly is disclosed and comprises a printed circuit board (PCB), and a power management module positioned on and electrically coupled to the PCB. The power management module comprises a substrate, a power management circuit chip positioned on, under or inside the substrate, and electrically coupled to the substrate, and a shield can positioned over the substrate and providing electromagnetic shielding for the power management module. The assembly further comprises a self-shielded reactive circuit element positioned on and electrically coupled to the PCB, wherein the self-shielded reactive circuit element is positioned adjacent to the power management module.

In an Example 44 that depends upon Example 43, the reactive circuit element comprises a coil.

In an Example 45 that depends upon Example 43, the reactive circuit element comprises a capacitor.

In an Example 46, a self-shielded reactive circuit element assembly is disclosed, and comprises a reactive circuit element having a first terminal and a second terminal, and an electrically insulative material surrounding the reactive circuit element and leaving exposed a first contact coupled to the first terminal and a second contact coupled to the second terminal, the electrically insulative material defining an interface surface configured to interface with a substrate, and one or more remaining surfaces. The assembly further comprises a conductive film formed over at least a portion of the remaining surfaces of the electrically insulative material.

In an Example 47 that depends upon Example 46, the reactive circuit element comprises a coil.

In an Example 48 that depends upon Example 46, the reactive circuit element comprises a capacitor.

While embodiments of an example apparatus has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

The invention claimed is:

1. A circuit assembly, comprising:
   a printed circuit board (PCB);
   a power management arrangement positioned on and operably coupled to the PCB, the power management arrangement having
      a substrate
      a power management circuit chip electrically coupled to the substrate, and
      a shield can covering the substrate and electromagnetically shielding the power management arrangement;
   a single self-shielded coil electrically coupled to the PCB and disposed adjacent to the power management arrangement, the single self-shielded coil having:
      a coil conductor, and
      a protective layer having a first conductive layer, a second conductive layer, and an insulative layer between a first conductive layer and a second conductive layer, the protective layer conformally surrounding an uppermost surface and a sidewall of the coil conductor.

2. The circuit assembly of claim 1, wherein the single self-shielded coil further comprises:
   an insulative material disposed between the coil conductor and the protective layer, surrounding the coil conductor, and leaving exposed a first contact coupled to a first terminal of the coil conductor and a second contact coupled to a second terminal of the coil conductor, the insulative material defining an interface surface configured to interface with the PCB, and one or more remaining surfaces.

3. The circuit assembly of claim 2, wherein the first conductive layer has one or more first slits.

4. The circuit assembly of claim 3, wherein the second conductive layer comprises one or more second slits that differ from the one or more first slits.

5. The circuit assembly of claim 3, wherein the one or more first slits comprise a plurality of elongate, parallel slits extending solely in a first direction, and wherein the second conductive layer has a plurality of elongate, parallel slits extending solely in a second direction different from the first direction.

6. The circuit assembly of claim 1, further comprising a first routing layer extending within the PCB and making electrical contact to the single self-shielded coil at a first contact end, and making electrical contact to the substrate of the power management arrangement at a second opposing contact end.

7. The circuit assembly of claim 6, further comprising a contact via extending through the substrate and electrically coupling the power management circuit chip on a first surface of the substrate, and making electrical contact to the first routing layer on a second surface of the substrate.

8. The circuit assembly of claim 6, further comprising a second routing layer extending within the PCB and electrically coupling the protective layer to ground.

9. The circuit assembly according to claim 8, wherein the second routing layer is between the power management arrangement and the first routing layer.

10. The circuit assembly of claim 1, wherein the first conductive layer and the second conductive layer leave two opposing sidewalls of the insulating layer partially exposed, and wherein bottommost surfaces of the protective layer are entirely confined between outer edges of the uppermost surface of the protective layer and are electrically connected by two or more paths.

11. The circuit assembly of claim 1, wherein the first conductive layer has a first pattern of parallel slits and the second conductive layer has a second pattern of parallel slits, and wherein the first pattern of parallel slits and the second pattern of parallel slits align such that the insulative layer does not have a conductive layer on either side of it at regular intervals in two different directions.

12. A self-shielded coil assembly, comprising:
   a coil conductor having a first terminal and a second terminal;
   an insulative material surrounding the coil conductor and leaving exposed a first contact coupled to the first terminal and a second contact coupled to the second terminal, the insulative material defining an interface surface configured to interface with a substrate, and one or more remaining surfaces; and
   a protective layer formed over at least a portion of the remaining surfaces of the insulative material and having
      a first conductive layer having a first plurality of parallel elongate slits extending solely in a first direction,
      a second conductive layer having a second plurality of parallel elongate slits extending solely in a second direction different from the first direction, and
      an insulative layer disposed between the first conductive layer and the second conductive layers.

13. The self-shielded coil assembly of claim 12, further comprising:
   a plurality of coil conductors each having a first terminal and a second terminal, the plurality of coil conductors being electrically coupled at the second terminal;
   an insulative material surrounding each of the plurality of coil conductors and leaving exposed a plurality of first contacts that are coupled to respective first terminals of the plurality of coil conductors, the insulative material defining an interface surface configured to interface with the substrate, and one or more remaining surfaces; and
   a protective layer formed over at least a portion of the remaining surfaces of the insulative material.

14. The self-shielded coil assembly of claim 12, further comprising:
   a coil conductor having a first terminal and a second terminal;

a capacitor structure having a first third terminal and a fourth terminal, the third terminal being electrically coupled to the second terminal and forming an intermediate node;

an insulative material surrounding the coil conductor and the capacitor structure, and leaving exposed a first contact, a second contact and a third contact that are respectively coupled to the first terminal, the intermediate node, and the fourth terminal, the insulating material defining an interface surface configured to interface with a PCB, and one or more remaining surfaces; and a protective layer formed over at least a portion of the remaining surfaces of the insulative material.

15. A circuit assembly, comprising:
a printed circuit board (PCB);
a power management arrangement positioned on and electrically coupled to the PCB, the power management arrangement comprising:
a substrate;
a power management circuit chip electrically coupled to the substrate;
a shield can positioned over the substrate; and
a single self-shielded reactive circuit element electrically coupled to the PCB, and disposed adjacent to the power management arrangement, the single self-shielded reactive circuit element having a protective shield formed of
a first conductive layer having a plurality of elongate slits extending solely in a first direction and
a second conductive layer having a second plurality of elongate slits extending solely in a second direction that is different from the first direction.

16. The circuit assembly of claim 15, wherein the single self-shielded reactive circuit element comprises a coil.

17. The circuit assembly of claim 15, wherein the single self-shielded reactive circuit element comprises a capacitor.

18. A self-shielded reactive circuit element assembly, comprising:
a reactive circuit element having a first terminal and a second terminal;
an insulative material surrounding the reactive circuit element and leaving exposed a first contact coupled to the first terminal and a second contact coupled to the second terminal, the insulative material defining an interface surface configured to interface with a substrate, and one or more remaining surfaces; and
a protective layer film formed over at least a portion of the remaining surfaces of the insulative material, the protective layer film having
a first conductive layer having a first plurality of elongate, parallel slits extending solely in a first direction,
a second conductive layer having a second plurality of elongate, parallel slits extending in a second direction different from the first direction, and
an insulative layer disposed between the first and second conductive layers.

19. The self-shielded reactive circuit element assembly of claim 18, wherein the reactive circuit element comprises a coil.

20. The self-shielded reactive circuit element assembly of claim 18, wherein the reactive circuit element comprises a capacitor.

* * * * *